United States Patent
Yoon

(10) Patent No.: US 9,214,648 B2
(45) Date of Patent: Dec. 15, 2015

(54) LIGHT EXTRACTION SUBSTRATE AND ORGANIC LIGHT-EMITTING DEVICE HAVING THE SAME

(71) Applicant: Samsung Corning Precision Materials Co., Ltd., Gyeongsangbuk-do (KR)

(72) Inventor: Hong Yoon, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/268,306

(22) Filed: May 2, 2014

(65) Prior Publication Data

US 2014/0326971 A1    Nov. 6, 2014

(30) Foreign Application Priority Data

May 6, 2013    (KR) .................. 10-2013-0050550

(51) Int. Cl.
*H01L 51/52* (2006.01)
*H01L 51/00* (2006.01)

(52) U.S. Cl.
CPC ........ *H01L 51/5262* (2013.01); *H01L 51/0096* (2013.01); *H01L 51/5275* (2013.01)

(58) Field of Classification Search
None
See application file for complete search history.

(56) References Cited

U.S. PATENT DOCUMENTS

| 2007/0166862 | A1 | 7/2007 | Kim et al. | |
| 2010/0276665 | A1* | 11/2010 | Wang | 257/15 |
| 2011/0147787 | A1 | 6/2011 | Do et al. | |
| 2011/0180779 | A1* | 7/2011 | Han et al. | 257/13 |
| 2012/0305966 | A1 | 12/2012 | Shin | |
| 2014/0138649 | A1* | 5/2014 | Chen et al. | 257/40 |

FOREIGN PATENT DOCUMENTS

| KR | 2007006373 | * 6/2007 |
| KR | 10-2011-0073259 | 6/2011 |
| KR | 10-2011-0122250 | 11/2011 |
| KR | 10-2012-0133961 | 12/2012 |

OTHER PUBLICATIONS

Do, Young Rag, Yoon-Chang Kim, Young-Woo Song, and Yong-Hee Lee. "Enhanced Light Extraction Efficiency from Organic Light Emitting Diodes by Insertion of a Two-dimensional Photonic Crystal Structure." Journal of Applied Physics 96.12 (2004): 7629.*

(Continued)

*Primary Examiner* — Joseph Schoenholtz
(74) *Attorney, Agent, or Firm* — Lerner, David, Littenberg, Krumholz & Mentlik, LLP

(57) ABSTRACT

A light extraction substrate which can realize a superior light extraction efficiency when applied to an organic light-emitting device, and an organic light-emitting device having the same. The light extraction substrate includes a base substrate and a matrix layer. One surface of the matrix layer adjoins to the base substrate, and the other surface of the matrix layer adjoins to an organic light-emitting diode. The light extraction substrate also includes a rod array disposed inside the matrix layer. The rod array includes at least one rod which is arranged in a direction normal to the one surface of the matrix layer. The rod array and a cathode of the organic light-emitting diode form an antenna structure which guides light generated from the organic light-emitting diode to be emitted in the normal direction.

8 Claims, 5 Drawing Sheets

(56) References Cited

OTHER PUBLICATIONS

Soon Moon Jeong and Hideo Takezoe (2012). Effect of Photonic Structures in Organic Light-Emitting Diodes—Light Extraction and Polarization Characteristics, Organic Light Emitting Devices, Prof. Jai Singh (Ed.), ISBN: 978-953-51-0850-4, InTech, DOI: 10.5772/54669.*

Optimizing the light extraction efficiency of LED/OLEDs using FDTD Solutions downloaded from URL <https://www.lumerical.com/tcad-products/fdtd/applications/led_light_extraction_fdtd.html> on Dec. 31, 2014.*

Rotherberg, L., "Efficient Light Extraction from Organic Light Emitting Diodes using Pasmonic Scattering Layers" Final report for Award No. DE-EE005274, University of Rochester, Nov. 30, 2012.*

Pschenitzka, F., "Light Extraction Technologies for Organic Light Emitting Devices for Lighting Applications", 2012 DOE Solid State Lighting R&D Workshop, Jan. 31-Feb. 2, 2012, Atlanta GA.*

Chang, Hong-Wei, Kun-Cheng Tien, Min-Hung Hsu, Yi-Hsiang Huang, Ming-Shiang Lin, Chih-Hung Tsai, Yu-Tang Tsai, and Chung-Chih Wu. "Organic Light-emitting Devices Integrated with Internal Scattering Layers for Enhancing Optical Out-coupling." Journal of the Society for Information Display 19.2 (2011): 196.*

Notice of Reasons for Refusal Application No. 10-2013-0050550, Korean Intellectual Property Office, Apr. 4, 2014.*

Written Opinion, Application No. 10-2013-0050550, Korean Intellectual Property Office, Sep. 5, 2014.*

Mcdaniel, S., and S. Blair. "Increased OLED Radiative Efficiency Using a Directive Optical Antenna." Optics Express 18.16 (2010): 17477.*

Fischer, Holger, and Olivier J. F. Martin. "Engineering the Optical Response of Plasmonic Nanoantennas." Optics Express 16.12 (2008): 9144.*

Podolskiy et al., "Light manipulation with plasmonic nanoantennas", Published in: Antennas and Propagation Society International Symposium, 2004, IEEE (vol. 2), Conference 20—Jun. 15, 2004, pp. 1915-1918.

Bakker et al., "Nanoantenna array-induced fluorescence enhancement and reduced lifetimes", Birck and NCN Publications, Paper 403, New Journal of Physics 10 (2008),Dec. 16, 2008, 18 pages.

* cited by examiner (a)

(b)

(c)

LIGHT EXTRACTION SUBSTRATE AND ORGANIC LIGHT-EMITTING DEVICE HAVING THE SAME

CROSS REFERENCE TO RELATED APPLICATION

The present application claims priority from Korean Patent Application Number 10-2013-0050550 filed on May 6, 2013, the entire contents of which are incorporated herein for all purposes by this reference.

BACKGROUND OF THE INVENTION

1. Field of the Invention

The present invention relates to a light extraction substrate and an organic light-emitting device having the same, and more particularly, to a light extraction substrate which can realize a superior light extraction efficiency when applied to an organic light-emitting device, and an organic light-emitting device having the same.

2. Description of Related Art

In general, an organic light-emitting diode (OLED) includes an anode, a light-emitting layer and a cathode. When a voltage is applied between the anode and the cathode, holes are injected from the anode into a hole injection layer and then migrate from the hole injection layer through a hole transport layer to the organic light-emitting layer, and electrons are injected from the cathode into an electron injection layer and then migrate from the electron injection layer through an electron transport layer to the light-emitting layer. Holes and electrons that are injected into the light-emitting layer recombine with each other in the light-emitting layer, thereby generating excitons. When the excitons transit from an excited state to a ground state, light is emitted.

Organic light-emitting displays including an OLED are divided into a passive matrix type and an active matrix type depending on the mechanism that drives the N*M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

However, as shown in FIG. 5, only about 20% of light generated from an OLED is emitted to the outside and about 80% of the light is lost by a waveguide effect originating from the difference in the refractive index between a glass substrate 10 and an organic light-emitting layer 30 which includes an anode 20, a hole injection layer, a hole transport layer, a light-emitting layer, an electron transport layer and an electron injection layer and by a total internal reflection originating from the difference in the refractive index between the glass substrate 10 and the air. Specifically, the refractive index of the internal organic light-emitting layer 30 ranges from 1.7 to 1.8, whereas the refractive index of indium tin oxide (ITO) which is generally used for the anode 20 ranges from 1.8 to 1.9. Since the two layers have a very small thickness ranging from 200 to 400 nm and the refractive index of glass used for the glass substrate 10 is about 1.5, a planar waveguide is thereby formed inside the organic light-emitting device. It is calculated that the ratio of the light lost in the internal waveguide mode due to the above-described reason is about 45%. In addition, since the refractive index of the glass substrate 10 is about 1.5 and the refractive index of the ambient air is 1.0, when the light is directed outward from the inside of the glass substrate 10, a ray of the light having an angle of incidence greater than a critical angle is totally reflected and is trapped inside the glass substrate 10. Since the ratio of the trapped light is up to about 35%, only about 20% of the generated light is emitted to the outside.

In addition, as shown in FIG. 6, in order to overcome the foregoing problem, in the related art, a low index grid (LIP) 50 is formed on the ITO anode 20. The grid 50 converts the direction of the light that travels in the waveguide mode to the front surface, thereby improving light extraction efficiency.

FIG. 7 shows simulation results on the organic light-emitting device shown in FIG. 6. The effect of improving the light extraction efficiency is increased when the refractive index of the grid 50 is lower. However, there are problems in that almost no materials have a refractive index of 1.2 or less and that the price of a material is more expensive when the refractive index is lower. In addition, when the grid 50 is formed on the ITO anode 20, as shown in FIG. 6, a stepped portion is formed. Consequently, a leakage current may occur. In addition, the organic light-emitting device shown in FIG. 6 has the problem of difficult processing. For example, in some cases, the surface of the anode 20 which adjoins the organic light-emitting layer 30 is metamorphosed in the process of forming the grid 50 on the ITO anode 20, thereby changing the work function. Furthermore, holes are not injected into the organic light-emitting layer 30 through the portion of the anode 20 on which the grid 50 is formed, and the size of the electric field applied thereto is different from the surroundings, thereby decreasing the uniformity of the light generated.

In addition, as shown in FIG. 8, in the related art, a convex-concave structure 60 is disposed under the anode 20 (with respect to the paper surface), i.e. in the interface between the anode 20 and the glass substrate 10, in order to improve light extraction efficiency.

As described above, the anode 20 and the organic light-emitting layer 30 generally serve as one light waveguide between the cathode 40 and the glass substrate 10. Accordingly, in the state in which the anode 20 and the organic light-emitting layer 30 act in a waveguide mode, when the nanoscale convex-concave structure 60 which causes light scattering is formed on the surface that adjoins the anode 20, the waveguide mode is disturbed, so that the quantity of light that is extracted to the outside is increased. However, when the convex-concave structure 60 is formed below the anode 20, the shape of the anode 20 resembles the shape of the convex-concave structure 60 below the anode 20, thereby increasing the possibility that a sharp portion may be localized. Since the OLED has a stacked structure of very thin films, when the anode 20 has a sharp protruding portion, the current is concentrated in that portion, which is a cause of a large leakage current or decreases power efficiency. Accordingly, in order to prevent such deterioration of the electrical characteristics, a flat film 70 is necessarily added when the convex-concave structure 60 is formed below the anode 20. The flat film 70 is required to be made of a material that anode 20. When the refractive index of the flat film 70 is low, most of the light is reflected at the interface between the anode 20 and the flat film 70 and then is trapped between the anode 20 and the organic light-emitting layer 30, which is referred to as the waveguide mode. In addition, the flat film 70 is required to be as thin as possible. If the flat film 70 is too thick, more light may be unnecessarily absorbed, and the distance between the convex-concave structure 60 and the organic light-emitting layer 30 may become too large, thereby reducing the scattering effect.

The information disclosed in the Background of the Invention section is provided only for enhancement of (or better) understanding of the background of the invention, and should not be taken as an acknowledgment or any form of suggestion that this information forms a prior art that would already be known to a person skilled in the art.

RELATED ART DOCUMENT

Patent Document 1: Japanese Unexamined Patent Publication No. 2007-35430 (Feb. 8, 2007)

BRIEF SUMMARY OF THE INVENTION

Various aspects of the present invention provide a light extraction substrate which can realize a superior light extraction efficiency when applied to an organic light-emitting device, and an organic light-emitting device having the same.

In an aspect of the present invention, provided is a light extraction substrate that includes a base substrate and a matrix layer. One surface of the matrix layer adjoins to the base substrate, and the other surface of the matrix layer adjoins to an organic light-emitting diode. The light extraction substrate also includes a rod array disposed inside the matrix layer. The rod array includes at least one rod which is arranged in a direction normal to the one surface of the matrix layer. The rod array and a cathode of the organic light-emitting diode form an antenna structure which guides light generated from the organic light-emitting diode to be emitted in the normal direction.

According to an embodiment of the present invention, the rod array may include a plurality of rod arrays disposed inside the matrix layer.

Here, respective arrays of the plurality of rod arrays may include the same number or different numbers of the rods.

The rods may be made of a material having a greater refractive index than the matrix layer.

Here, the rods may be made of a dielectric material or a metal.

The width of the rod may range from 100 to 400 nm, and the thickness of the rod may range from 100 to 400 nm.

The at least one rod of the rod array may include a plurality of rods which are spaced apart from each other at equal distances in the normal direction.

Here, each of the equal distances ranges from 10 to 500 nm.

In addition, the cathode may be a reflector of the antenna structure, and the rod array may be a director of the antenna structure.

In another aspect of the present invention, provided is an organic light-emitting device including the above-mentioned light extraction substrate as an internal light extraction substrate.

According to embodiments of the present invention, the rod array and the cathode of the OLED form the antenna structure. The light extraction substrate applied as the internal light extraction layer of the organic light-emitting device can improve the light extraction efficiency of the organic light-emitting device by improving the directivity of light generated from the OLED. This makes it possible to operate the organic light-emitting device at a low current, and thus the power consumption of the LED 1 can be reduced and the luminance of the LED 1 can be improved.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
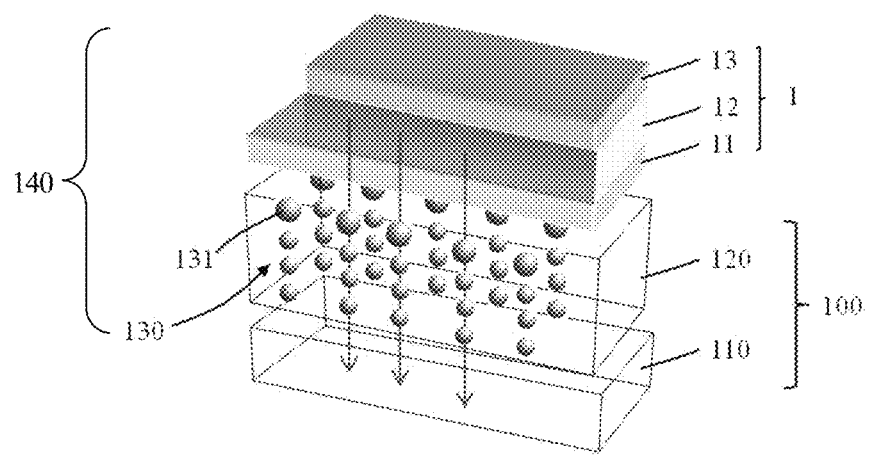
FIG. 1 is a schematic view showing a light extraction substrate and an organic light-emitting device according to an embodiment of the invention.

Reference will now be made in detail to a light extraction substrate and an organic light-emitting device having the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, a light extraction substrate 100 according to an exemplary embodiment of the invention is an internal light extraction substrate that is disposed on one surface of an OLED 1 through which light generated from the OLED 1 is emitted outward in order to improve the light extraction efficiency of the organic light-emitting device. When the organic light-emitting device in which the light extraction substrate 100 according to this embodiment is used is a bottom emission type organic light-emitting device, the light extraction substrate 100 faces an anode 11 of the OLED 1. The light extraction substrate 100 not only improves the light extraction efficiency of the organic light-emitting device, but also protects the OLED 1 from the external environment while serving as a passage through which light generated from the OLED 1 is emitted outward.

According to this embodiment, the OLED 1 has a stacked structure in which the anode 11, an organic light-emitting layer 12 and a cathode 13 are sandwiched between the light extraction substrate 100 and another substrate (not shown)

that faces the light extraction substrate 100. The anode 11 can be made of a metal or a metal oxide, such as gold (Au), indium (In), tin (Sn) or indium tin oxide (ITO), which has a significant work function in order to facilitate the hole injection. The cathode 13 can be made of a metal having a smaller work function in order to facilitate the electron injection. According to this embodiment, the cathode 13 can be made of a metal thin film of a light reflecting material, such as Al, Al:Li or Mg:Ag, since the cathode 13 serves as a reflector that forms an antenna structure together with a rod array which will be described later. The organic light-emitting layer 12 includes a hole injection layer, a hole transport layer, a light-emitting layer, an electron transport layer and an electron injection layer which are sequentially stacked on the anode 11. With this structure, when a forward voltage is applied between the anode 11 and the cathode 13, electrons from the cathode 13 migrate to the light-emitting layer through the electron injection layer and the electron transport layer, and holes migrate to the light-emitting layer through the hole injection layer and the hole transport layer. The electrons and holes that have migrated into the light-emitting layer recombine with each other, thereby generating excitons. When these excitons transit from an excited state to a ground state, light is emitted. The brightness of the light emitted is proportional to the amount of current that flows between the anode 11 and the cathode 13.

The light extraction substrate 100 provided as an internal light extraction substrate of the organic light-emitting device includes a base substrate 110, a matrix layer 120 and the rod array 130.

The base substrate 110 supports the matrix layer 120 which is formed on one surface of the base substrate 110. The base substrate 110 also serves as an encapsulation substrate to protect the OLED 1 from the external environment as the matrix layer 120 including the rod array 130 is applied as an internal light extraction layer of the organic light-emitting device.

The base substrate 110 can be implemented as any transparent substrate that has superior light transmittance and superior mechanical properties. For instance, the base substrate 110 can be made of a polymeric material, such as a thermally or ultraviolet (UV) curable organic film, or a chemically strengthened glass, such as soda-lime glass ($SiO_2$—CaO—$Na_2O$) or aluminosilicate glass ($SiO_2$—$Al_2O_3$—$Na_2O$). When the organic light-emitting device that employs the light extraction substrate 100 according to this embodiment as the internal light extraction substrate is used for illumination, the base substrate 110 can be made of soda-lime glass. When the OLED 1 is used for display, the base substrate 110 can be made of aluminosilicate glass. The base substrate 110 can be implemented as a substrate made of a metal oxide or a metal nitride. According to this embodiment, the base substrate 110 can be made of a thin glass having a thickness of 1.5 mm or less. The thin glass can be made using a fusion process or a floating process.

The matrix layer 120 is formed on one surface of the base substrate 110. When the light extraction substrate 100 is employed in the organic light-emitting device, the matrix layer 120 serves as an internal light extraction layer of the organic light-emitting device. Thus, one surface of the matrix layer 120 adjoins to the base substrate 110, and the other surface of the matrix layer 120 adjoins to the OLED 1, more particularly, the anode 11 of the OLED 1. The matrix layer 120 can be made of a material that has a lower refractive index than rods 131 which are components of the rod array 130 provided inside the matrix layer 120. In addition, the matrix layer 120 can be made of a material that has a similar refractive index to the base substrate 110. For instance, the matrix layer 120 can be made of a metal oxide, more particularly, one selected from among $TiO_2$, $SnO_2$, $Al_2O_3$ and ZnO.

The rod array 130 is provided inside the matrix layer 120. The rod array 130 includes at least one rod 131 which is arranged in a direction normal to one surface of the matrix layer 120. The rod array 130 forms an antenna structure 140 together with the cathode 13 of the OLED 1. Due to the antenna structure 140 which is composed of the rod array 130 and the cathode 13, light generated from the OLED 1 is emitted in the direction of an antenna (red arrows in the figure). In other words, the antenna structure 140 composed of the rod array 130 and the cathode 13 serves to guide the light generated from the OLED 1 to be emitted in the direction of the rod array 130. When the generated light is guided to be then emitted in a specific direction by the antenna structure 140, the light extraction efficiency of the organic light-emitting device can be improved. When the light extraction efficiency of the organic light-emitting device is improved, it is possible to operate the organic light-emitting device at a low current. Consequently, the power consumption of the LED 1 can be reduced and the luminance of the LED 1 can be improved. In this antenna structure 140, the cathode 13 serves as a reflector, and the rod array 130 serves as a director.

The rod array 130 can include a plurality of rod arrays 130 which are disposed inside the matrix layer 120. As shown in FIG. 1, the plurality of rod arrays 130 can be disposed inside the matrix layer 120 such that the rod arrays 130 are arranged in one direction and spaced apart from each other. As the number of the rod arrays 130 is greater, there is a greater possibility of guiding most of the light generated from the OLED 1 in an intended direction and thus improve the light extraction efficiency of the organic light-emitting device. The number of the rods 131 of the respective rod arrays 130 can be the same or different. For instance, in the plurality of rod arrays 130 disposed inside the matrix layer 120, one rod array 130 can be composed of two rods 131, whereas another rod array 130 is composed of one rod 131. Alternatively, only one rod array 130 can be composed of one rod 131, whereas the other rod arrays 130 are composed of two or three rods 131. The number of the rods 131 of the rod arrays 130 can vary depending on the respective rod arrays 130, and this embodiment does not specifically limit the number of the rods 131 of the rod arrays 130.

When the rod array 130 is composed of a plurality of rods 131, the rods 131 can be spaced apart from each other at equal distances in a direction normal to one surface of the matrix layer 120. For instance, the plurality of rods 131 may be spaced apart from each other in the normal direction, at distances ranging from 10 to 500 nm. Here, when the distances between the rods 131 are equal, the effect of the antenna structure 140 that imparts directionality to generated light can be realized.

The rods 131 which compose the rod arrays 130 in this manner can be made of a material that has a greater refractive index than the matrix layer 120. At this time, the rods 131 can be made of a dielectric material or a metal. In addition, each of the width and thickness of the rod 131 may range from 100 to 400 nm.

Figure 2:
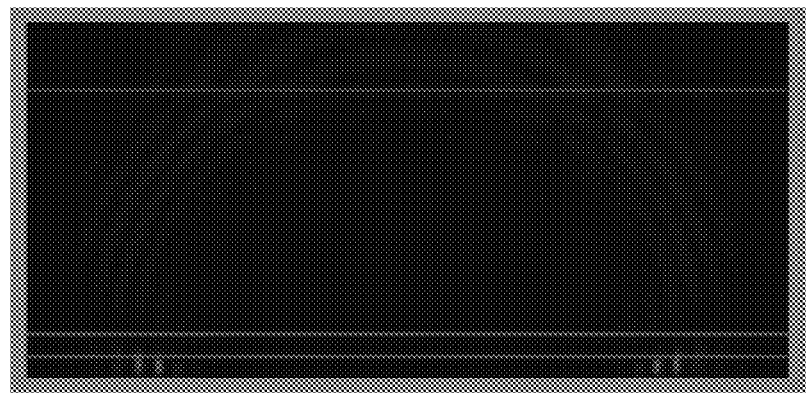
FIG. 2 is images showing optical simulation results on the geometry of propagation of a dipole light source generated from an OLED according to the presence and absence of a rod array and the number of rods of the rod array.
Figure 2:
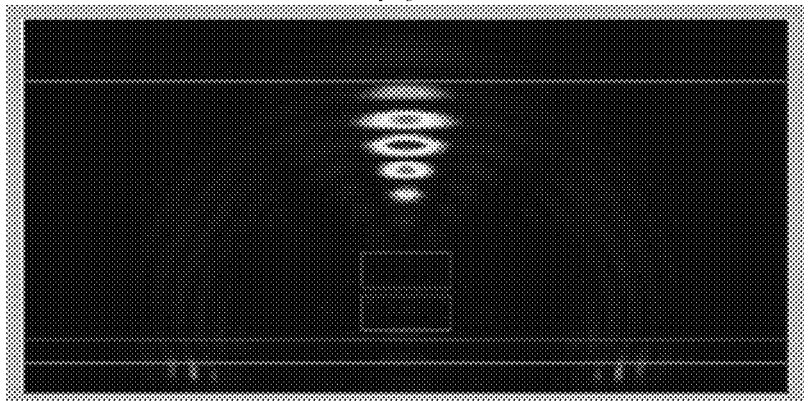
Figure 2:
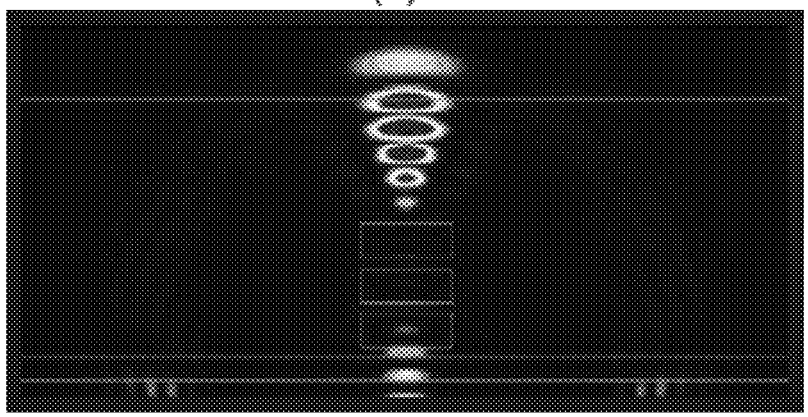
Figure 3:
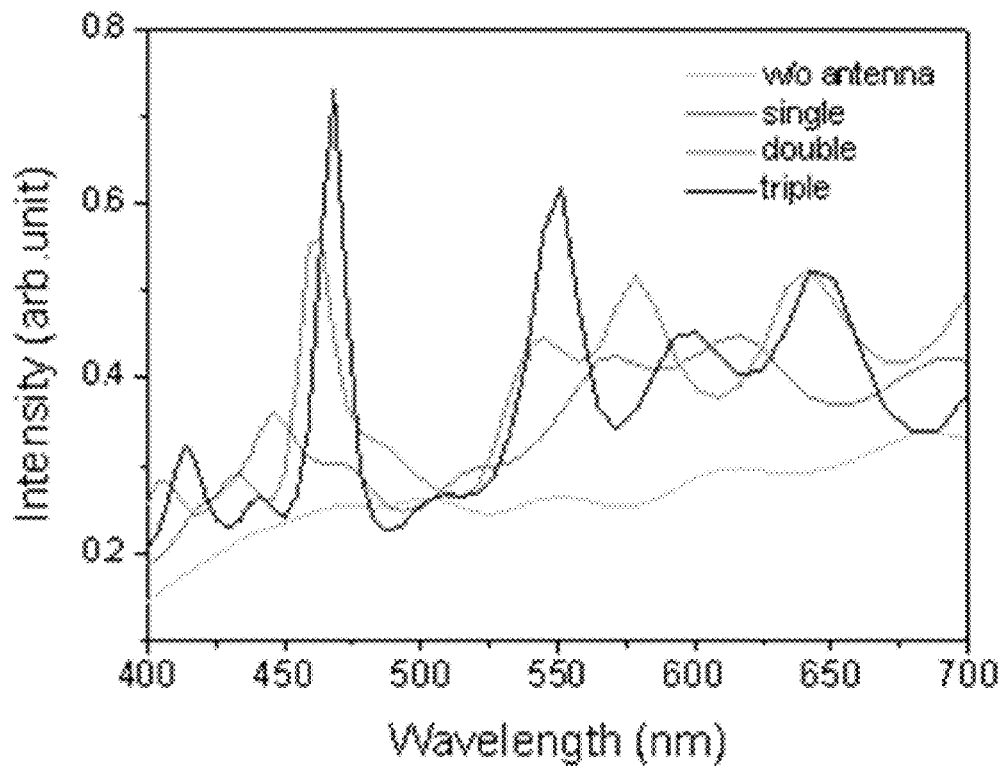
FIG. 3 is a graph showing a light extraction efficiency spectrum according to the presence and absence of a rod array and the number of rods of the rod array.
Figure 4:
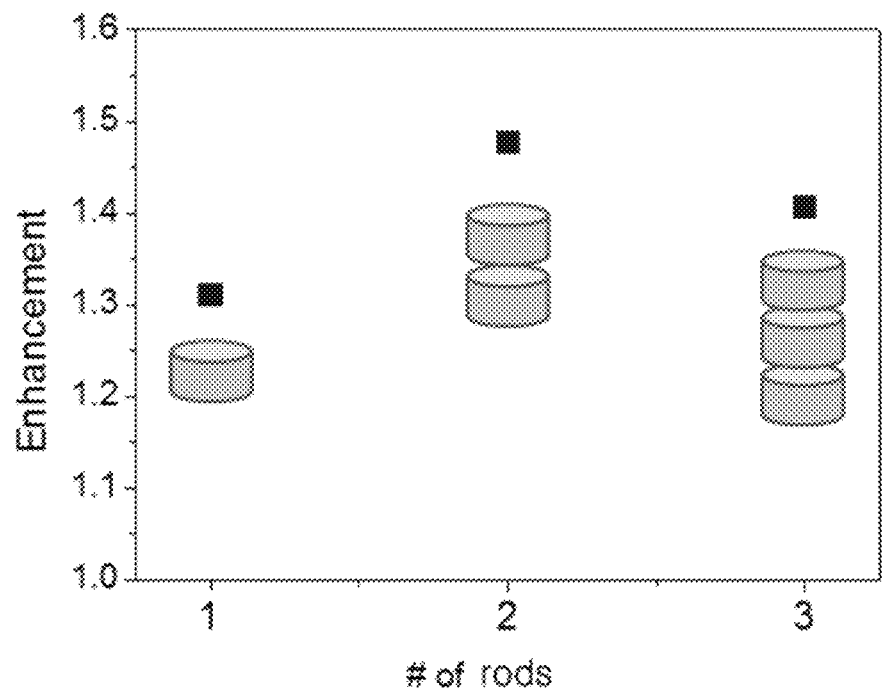
FIG. 4 is a graph showing the light extraction efficiency according to the number of rods.
Figure 5:
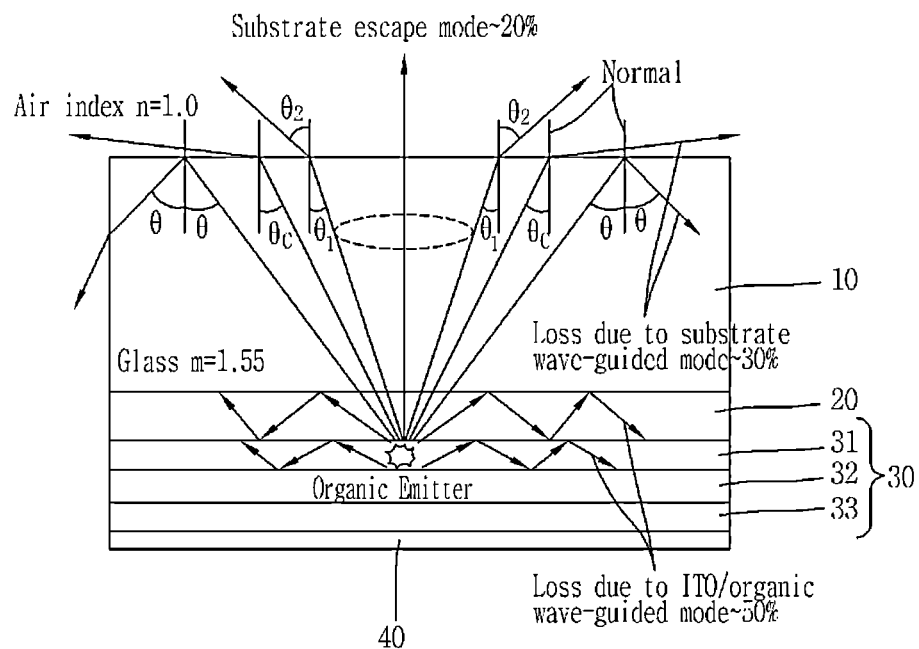
FIG. 5 is a conceptual view depicting the cross-section of an organic light-emitting device of the related art and the light extraction efficiency thereof.
Figure 6:
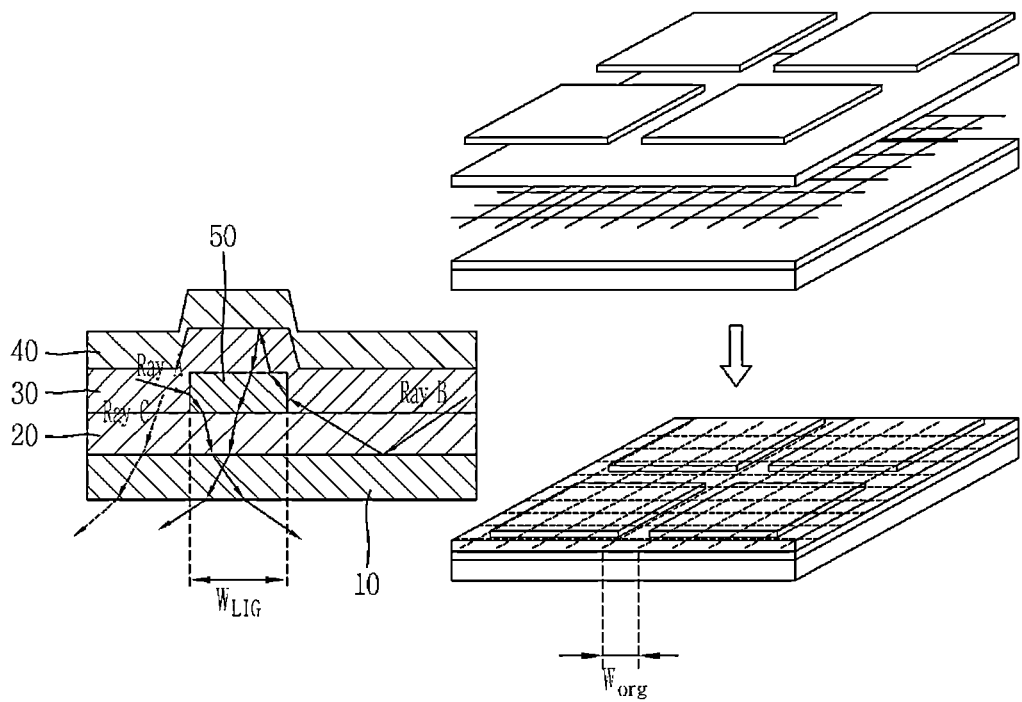
FIG. 6 is cross-sectional, exploded and assembled views showing an another organic light-emitting device of the related art.
Figure 7:
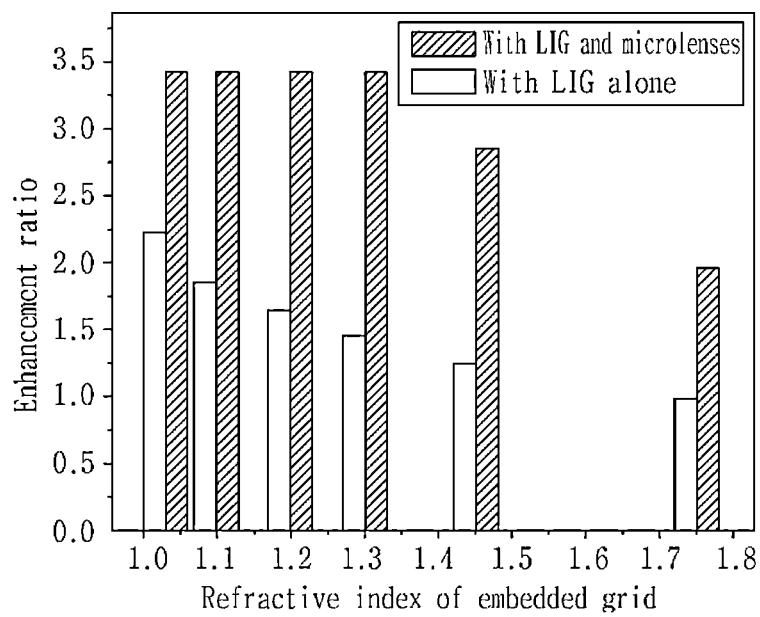
FIG. 7 is a graph showing simulation results on the light extraction efficiency of the organic light-emitting device shown in FIG. 5.
Figure 8:
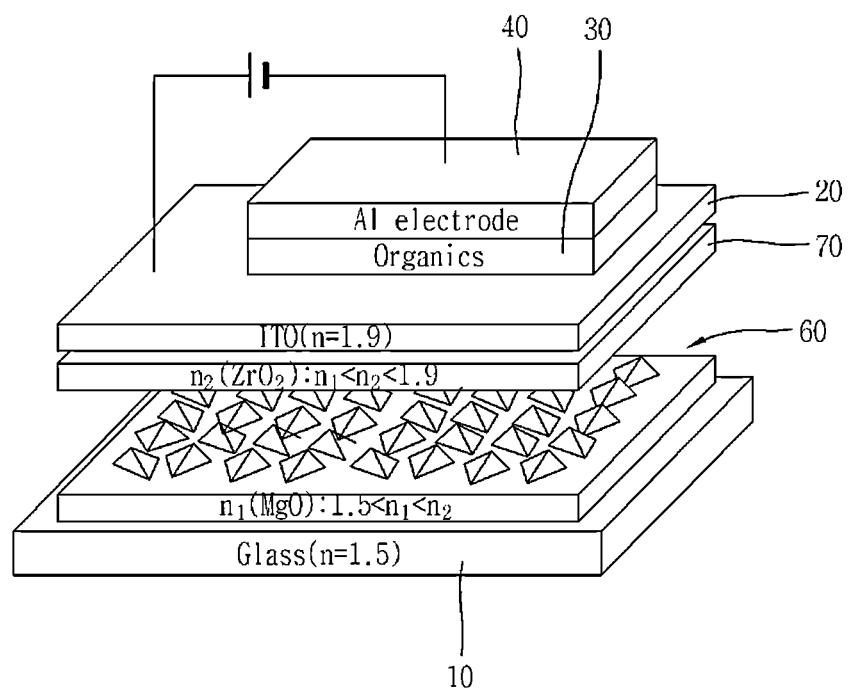
FIG. 8 is an exploded perspective view showing a further organic light-emitting device of the related art.

FIG. 2 to FIG. 4 are three-dimensional (3D) simulation results intended to confirm the light extraction effect of a rod array according to an embodiment of the invention. Here, a rod having a diameter of 200 nm and a height of 300 nm was used for the 3D simulation. When a plurality of rods was used for simulation, each of the distances between the rods was set to 60 nm.

First, FIG. 2 is images showing optical simulation results on the geometry of propagation of a dipole light source generated from an OLED. In FIG. 2, part (a) is the image when there was no rod array, part (b) is the image when the rod array had two rods, and part (c) is the image when the rod array had three rods. As apparent from the images of FIG. 2, more light energy was extracted from the glass substrate when there was the rod array as in parts (b) and (c) compared to when there was no rod array as in part (a).

FIG. 3 and FIG. 4 are graphs showing a light extraction efficiency spectrum and light extraction levels according to the number of rods. As apparent from these figures, the light extraction efficiency was improved when there was at least one rod compared to when there was no rod. In addition, selectivity for a specific wavelength was improved depending on the number of rods.

The foregoing descriptions of specific exemplary embodiments of the present invention have been presented with respect to the drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A light extraction substrate comprising:
   a base substrate;
   a matrix layer, wherein one surface of the matrix layer adjoins to the base substrate, and the other surface of the matrix layer adjoins to an organic light-emitting diode; and
   a plurality of rod arrays disposed inside the matrix layer, each rod array comprising a plurality of rods which are arranged in a direction normal to the one surface of the matrix layer, the rods in each rod array being spaced apart from one another in the normal direction,
   wherein the plurality of rod arrays serve as a director of an antenna structure, and a cathode of the organic light emitting diode serves as a reflector of the antenna structure, such that the plurality of rod arrays and the cathode form the antenna structure which guides light generated from the organic light-emitting diode to be emitted in the normal direction.

2. The light extraction substrate according to claim 1, wherein each of the plurality of rod arrays comprises a same number of the rods, or at least some of the rod arrays comprise different numbers of the rods.

3. The light extraction substrate according to claim 1, wherein the plurality of rods are made of a material having a greater refractive index than the matrix layer.

4. The light extraction substrate according to claim 3, wherein the plurality of rods are made of a dielectric material or a metal.

5. The light extraction substrate according to claim 1, wherein a width of a rod of the plurality of rods ranges from 100 to 400 nm, and a thickness of a rod of the plurality of rods ranges from 100 to 400 nm.

6. The light extraction substrate according to claim 1, wherein the plurality of rods are spaced apart from each other at an equal distance in the normal direction.

7. The light extraction substrate according to claim 6, wherein the equal distance ranges from 10 to 500 nm.

8. An organic light-emitting device comprising the light extraction substrate as claimed in claim 1 as an internal light extraction substrate.

* * * * *